(12) United States Patent
Ishima et al.

(10) Patent No.: US 12,469,639 B2
(45) Date of Patent: Nov. 11, 2025

(54) METHOD FOR MANUFACTURING MULTILAYER COIL COMPONENT

(71) Applicant: TDK CORPORATION, Tokyo (JP)

(72) Inventors: Yuya Ishima, Tokyo (JP); Shinichi Kondo, Tokyo (JP); Kosuke Ito, Tokyo (JP); Shingo Hattori, Tokyo (JP)

(73) Assignee: TDK CORPORATION, Tokyo (JP)

( * ) Notice: Subject to any disclaimer, the term of this patent is extended or adjusted under 35 U.S.C. 154(b) by 847 days.

(21) Appl. No.: 17/686,599

(22) Filed: Mar. 4, 2022

(65) Prior Publication Data

US 2022/0293339 A1  Sep. 15, 2022

(30) Foreign Application Priority Data

Mar. 9, 2021 (JP) ................ 2021-037457
Dec. 23, 2021 (JP) ................ 2021-209055

(51) Int. Cl.
*G03F 7/00* (2006.01)
*H01F 41/04* (2006.01)
*H01F 41/12* (2006.01)

(52) U.S. Cl.
CPC ......... *H01F 41/043* (2013.01); *G03F 7/0035* (2013.01); *H01F 41/12* (2013.01)

(58) Field of Classification Search
CPC ........... G03F 7/0035; G03F 7/094; G03F 7/09
See application file for complete search history.

(56) References Cited

U.S. PATENT DOCUMENTS

| | | |
|---|---|---|
| 2006/0213602 A1 | 9/2006 | Yoshida et al. |
| 2008/0257488 A1 | 10/2008 | Yamano |
| 2012/0227250 A1 | 9/2012 | Yamano |
| 2015/0170834 A1 | 6/2015 | Yamano |

FOREIGN PATENT DOCUMENTS

| | | |
|---|---|---|
| JP | 2001-352169 A | 12/2001 |
| JP | 2004-253771 A | 9/2004 |
| JP | 2005-197584 A | 7/2005 |
| JP | 2006-153938 A | 6/2006 |
| JP | 2007-019438 A | 1/2007 |
| JP | 2007-318039 A | 12/2007 |
| JP | 4816971 B2 | 11/2011 |

*Primary Examiner* — Daborah Chacko-Davis
(74) *Attorney, Agent, or Firm* — Oliff PLC

(57) ABSTRACT

A method for manufacturing a multilayer coil component 1 includes forming a plurality of insulator layers by a photolithography method using a photosensitive insulator paste, forming a plurality of conductors and via conductors by a photolithography method using a photosensitive conductive paste, a step of forming a first conductor, a step of forming a first insulator layer around the first conductor such that it becomes even with an upper surface of the first conductor, a step of forming a second insulator layer provided with a via hole on the first conductor and the first insulator layer, and a step of forming a second conductor connected to the first conductor via the via hole on the second insulator layer.

4 Claims, 5 Drawing Sheets

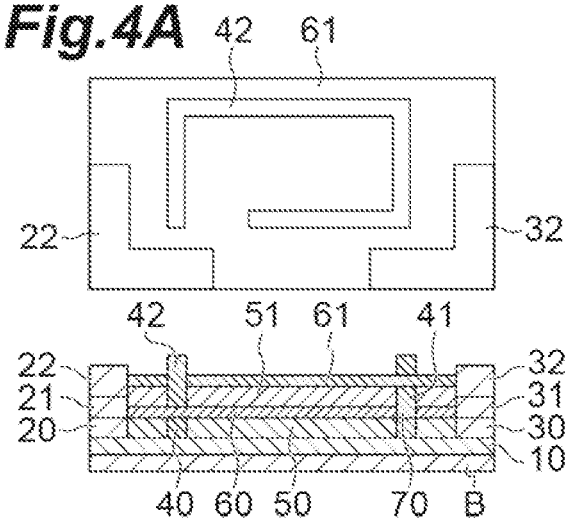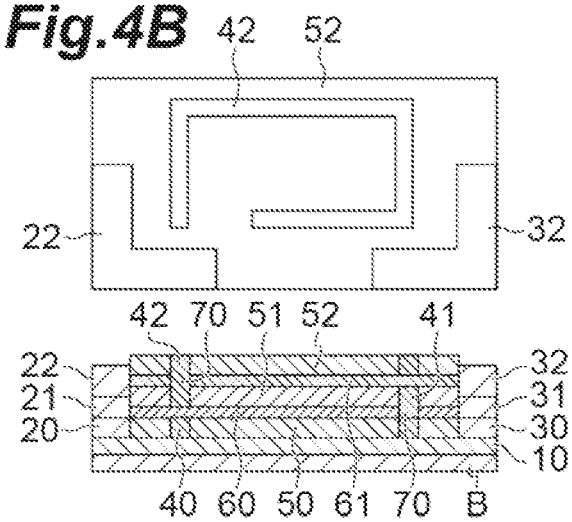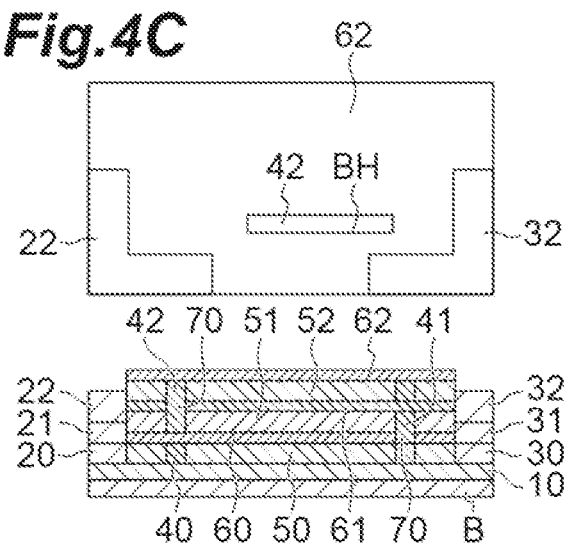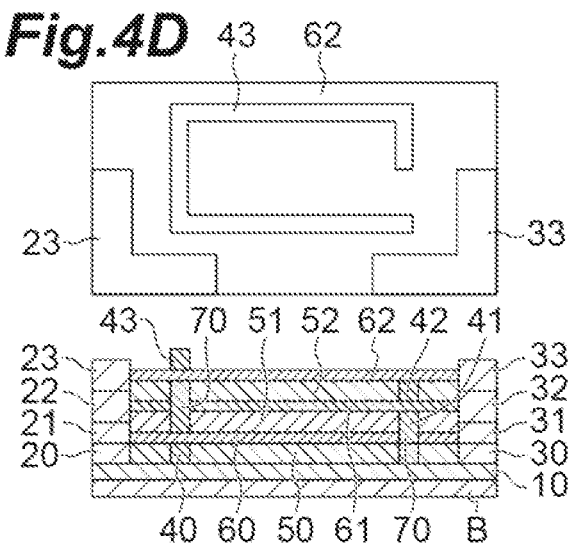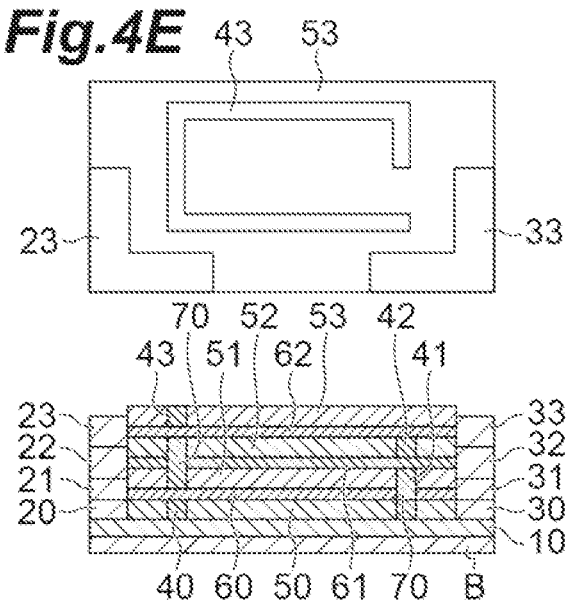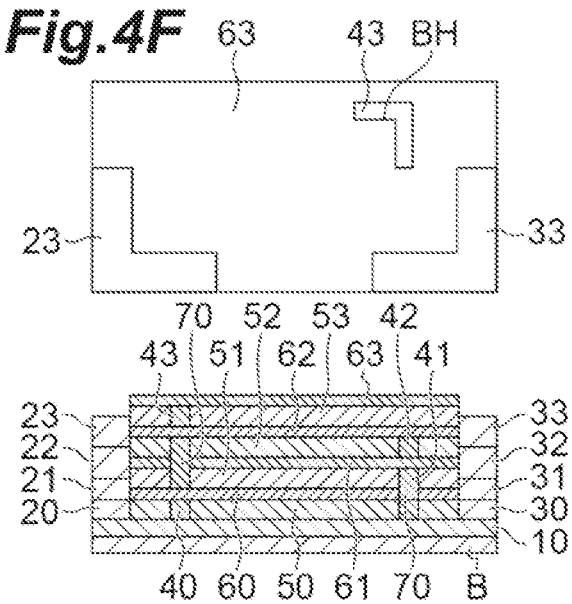

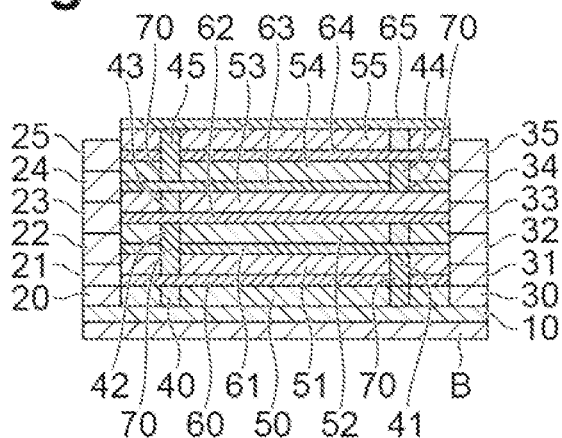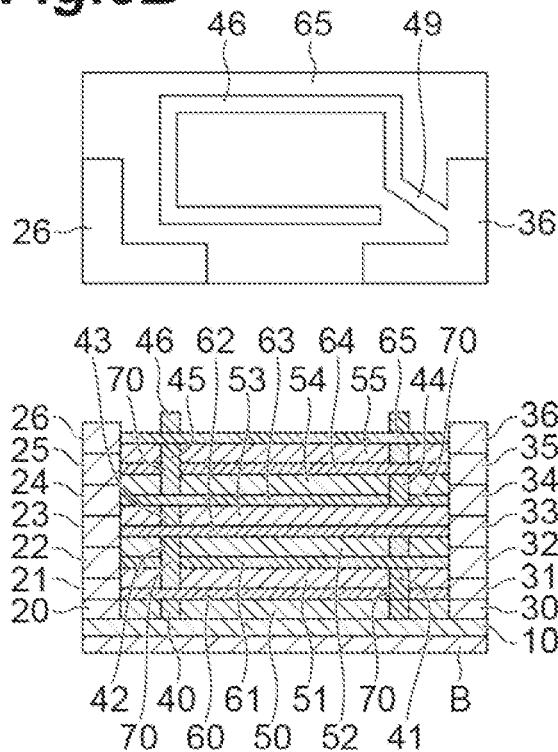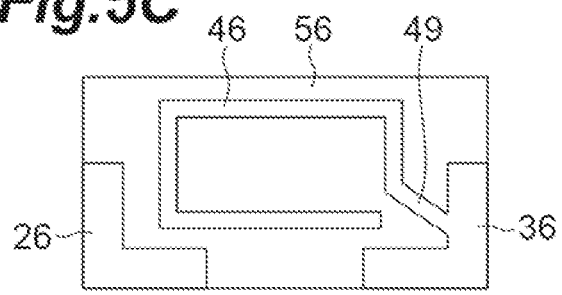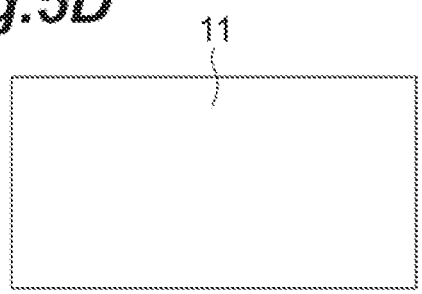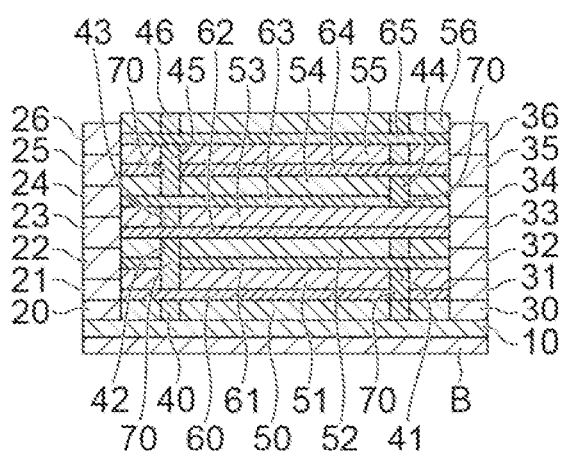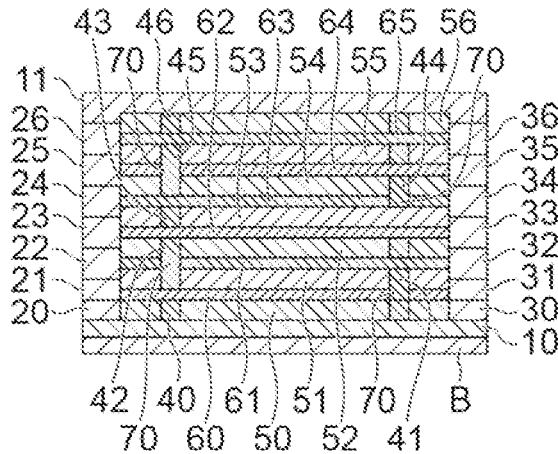
Fig.5A Fig.5B Fig.5C Fig.5D

METHOD FOR MANUFACTURING MULTILAYER COIL COMPONENT

TECHNICAL FIELD

The present invention relates to a method for manufacturing a multilayer coil component.

BACKGROUND

Regarding methods for manufacturing a multilayer coil component in the related art, for example, the method described in Patent Literature 1 (Japanese Patent No. 4816971) is known. The method for manufacturing a multilayer coil component described in Patent Literature 1 includes a multilayering step for forming a multilayered body which has a plurality of chips including a coil body that is involved in an insulating layer and a pair of external electrodes that are connected to both ends of the coil body and exposed from the insulating layer. The multilayering step has a first process in which a conductive pattern for a coil body is formed on the insulating layer by a photolithography method using a conductive paste and an external electrode pattern for an external electrode is formed on a side portion of the insulating layer, and a second process in which the insulating layer having a via hole for looking into the conductive pattern and a cutout portion leading to the external electrode pattern is formed on the conductive pattern and the external electrode pattern by a photolithography method using an insulating paste.

SUMMARY

Multilayer coil components are desired to be miniaturized and to be improved in characteristics. In order to achieve miniaturization and improvements in the characteristics of multilayer coil components, there is a need to reduce a thickness of an insulator layer between adjacent conductive patterns. In a method for manufacturing a multilayer coil component in the related art, an insulator layer provided around a conductive pattern and an insulator layer between the conductive patterns are formed at the same time. In this method, the thickness of the insulator layer between the conductive patterns cannot be reduced.

An object of an aspect of the present invention is to provide a method for manufacturing a multilayer coil component, in which an insulator layer between conductors can be thinned.

According to an aspect of the present invention, there is provided a method for manufacturing a multilayer coil component including an element body formed to have a plurality of insulator layers layered therein, and a coil disposed inside the element body and constituted to include a plurality of conductors and via conductors connecting the corresponding conductors to each other. The method for manufacturing a multilayer coil component includes forming the plurality of insulator layers by a photolithography method using a photosensitive insulator paste, forming the plurality of conductors and the via conductors by a photolithography method using a photosensitive conductive paste, a step of forming a first conductor, a step of forming a first insulator layer provided around the first conductor such that the first insulator layer becomes even with an upper surface of the first conductor, a step of forming a second insulator layer provided with a via hole for exposing a part of the first conductor on the first conductor and the first insulator layer, and a step of forming a second conductor connected to the first conductor via the via hole on the second insulator layer.

In the method for manufacturing a multilayer coil component according to the aspect of the present invention, the first insulator layer is formed such that it becomes even with the upper surface of the first conductor, and the second insulator layer provided with the via hole is formed on the first conductor and the first insulator layer. That is, the first conductor and the first insulator layer are formed such that the thicknesses thereof become equivalent to each other, and the second insulator layer is formed on the even upper surfaces of the first conductor and the first insulator layer. In this manner, in the method for manufacturing a multilayer coil component, since the second insulator layer is formed after heights of the first conductor and the first insulator layer are aligned, the thickness of the second insulator layer can be appropriately adjusted. For this reason, the thickness of the second insulator layer can be reduced. Therefore, in the method for manufacturing a multilayer coil component, the insulator layer between the conductors can be thinned.

According to an embodiment, in the step of forming the first insulator layer, after an entire area of a region including the first conductor is coated with the photosensitive insulator paste, the photosensitive insulator paste on the first conductor may be removed. In this method, the first insulator layer can be formed such that it becomes even with the upper surface of the first conductor.

According to the embodiment, in the step of forming the second conductor, the second conductor and the via conductors may be formed at the same time by filling the via hole with the photosensitive conductive paste. In this method, since the second conductor and the via conductors can be formed at the same time, the manufacturing step can be made efficient.

According to the embodiment, in the step of forming the first insulator layer, a thickness of the photosensitive conductive paste for coating an area around the first conductor may be caused to be larger than a thickness of the photosensitive conductive paste for coating the first conductor from above. In this method, since the photosensitive conductive paste on the first conductor is easily smoothed, a magnetic path length of the coil can be easily adjusted.

According to the aspect of the present invention, an insulator layer between conductors can be thinned.

BRIEF DESCRIPTION OF THE DRAWINGS

FIGS. 4A, 4B, 4C, 4D, 4E, and 4F are views illustrating another step of manufacturing a multilayer coil component.

FIGS. 5A, 5B, 5C, and 5D are views illustrating another step of manufacturing a multilayer coil component.

DETAILED DESCRIPTION

Hereinafter, a preferable embodiment of the present invention will be described in detail with reference to the accompanying drawings. In description of the drawings, the same reference signs are applied to elements which are the same or corresponding, and duplicate description thereof will be omitted.

Figure 1:
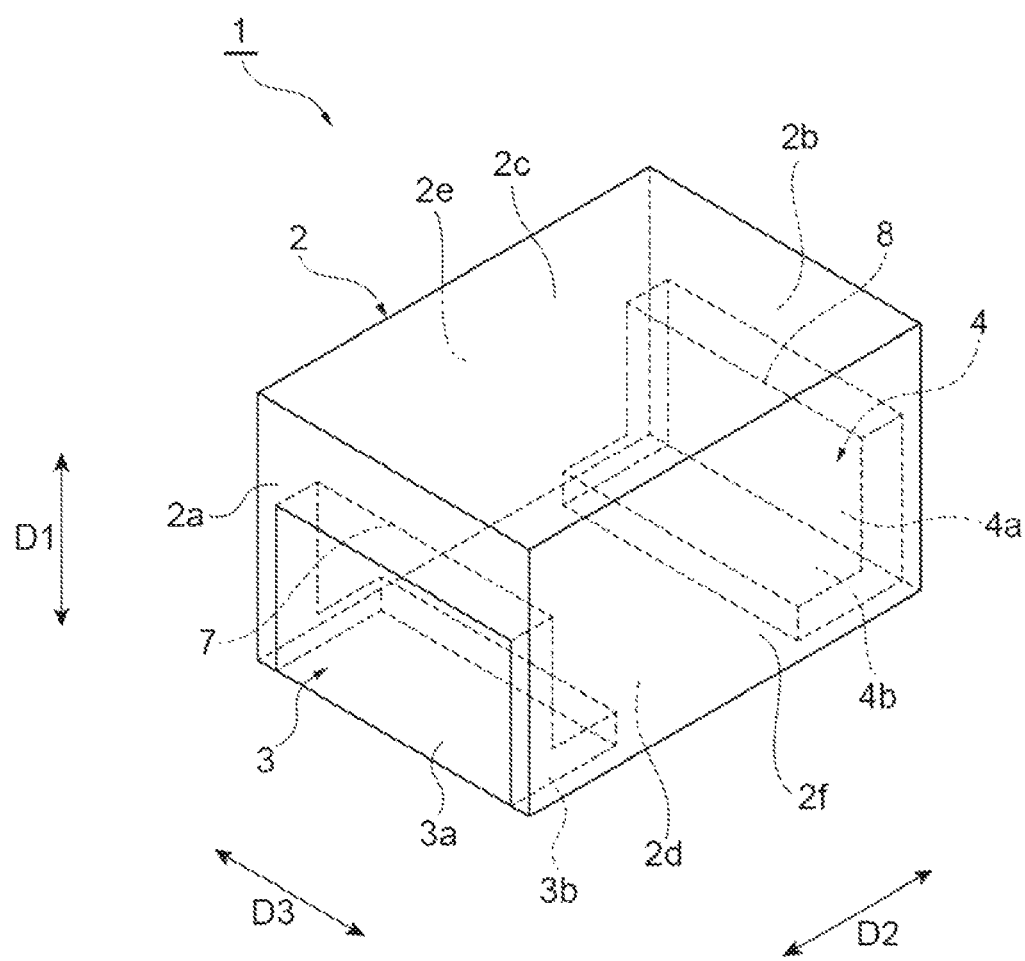
FIG. 1 is a perspective view of a multilayer coil component according to an embodiment.
Figure 2:
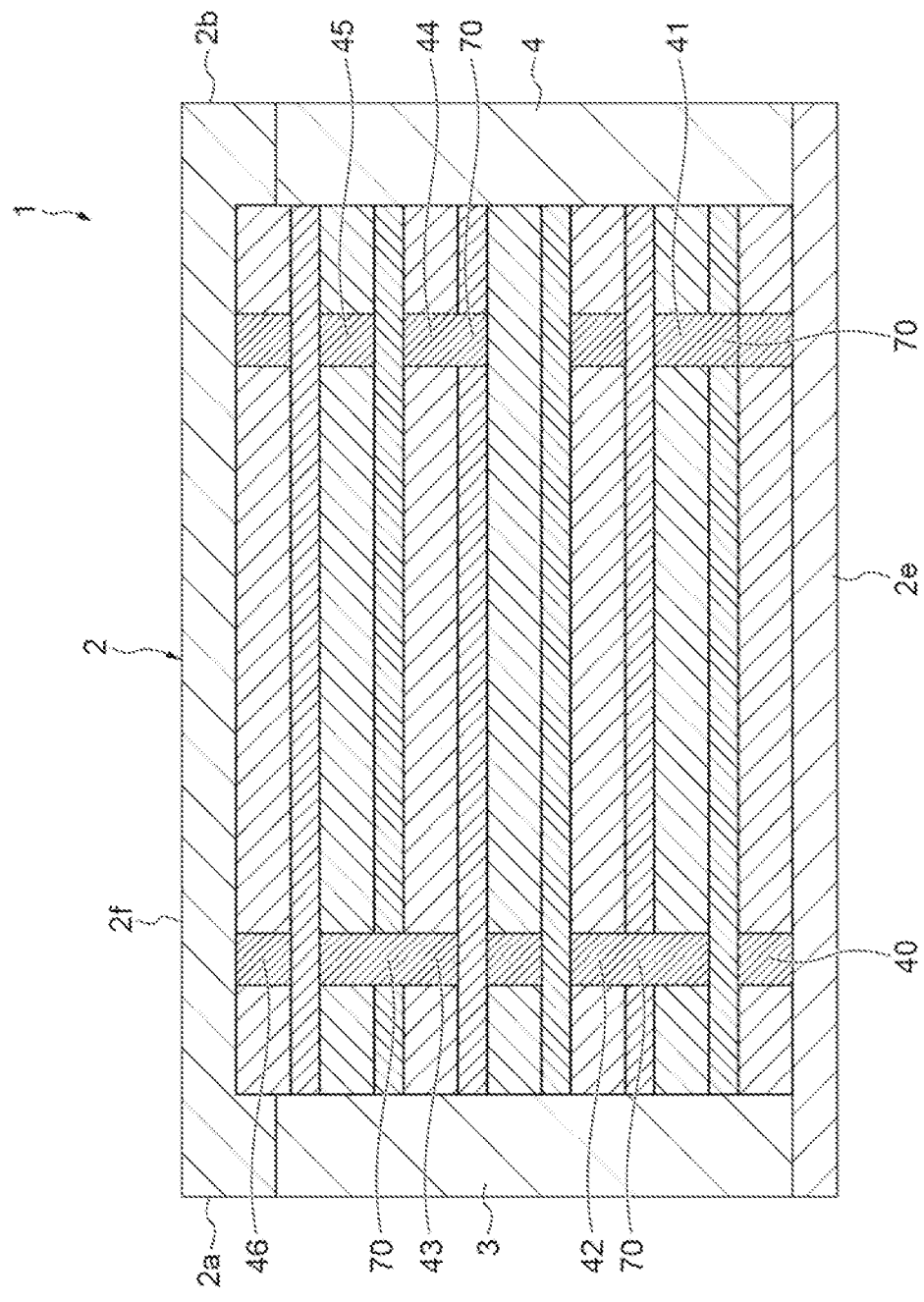
FIG. 2 is a view illustrating a cross-sectional constitution of the multilayer coil component.

With reference to FIGS. 1 and 2, a multilayer coil component according to the embodiment will be described. FIG. 1 is a perspective view of a multilayer coil component according to the embodiment. FIG. 2 is a view illustrating a cross-sectional constitution of the multilayer coil component. As illustrated in FIGS. 1 and 2, a multilayer coil component 1 includes an element body 2, a first terminal electrode 3, a second terminal electrode 4, and a coil 5.

The element body 2 exhibits a rectangular parallelepiped shape. The rectangular parallelepiped shape includes a rectangular parallelepiped shape in which corner portions and ridge line portions are chamfered and a rectangular parallelepiped shape in which corner portions and ridge line portions are rounded. The element body 2 has end surfaces 2a and 2b, main surfaces 2c and 2d, and side surfaces 2e and 2f, as outer surfaces. The end surfaces 2a and 2b face each other. The main surfaces 2c and 2d face each other. The side surfaces 2e and 2f face each other. Hereinafter, a facing direction of the main surfaces 2c and 2d will be referred to as a first direction D1, a facing direction of the end surfaces 2a and 2b will be referred to as a second direction D2, and a facing direction of the side surfaces 2e and 2f will be referred to as a third direction D3. The first direction D1, the second direction D2, and the third direction D3 are substantially orthogonal to each other.

The end surfaces 2a and 2b extend in the first direction D1 such that the main surfaces 2c and 2d are joined to each other. The end surfaces 2a and 2b also extend in the third direction D3 such that the side surfaces 2e and 2f are joined to each other. The main surfaces 2c and 2d extend in the second direction D2 such that the end surfaces 2a and 2b are joined to each other. The main surfaces 2c and 2d also extend in the third direction D3 such that the side surfaces 2e and 2f are joined to each other. The side surfaces 2e and 2f extend in the first direction D1 such that the main surfaces 2c and 2d are joined to each other. The side surfaces 2e and 2f also extend in the second direction D2 such that the end surfaces 2a and 2b are joined to each other.

The main surface 2d is a mounting surface. For example, it is a surface facing other electronic components (not illustrated) when the multilayer coil component 1 is mounted in other electronic components (for example, a circuit base material or a multilayered electronic component). The end surfaces 2a and 2b are surfaces which continue from the mounting surface (that is, the main surface 2d).

In the present embodiment, a length of the element body 2 in the second direction D2 is longer than a length of the element body 2 in the third direction D3 and a length of the element body 2 in the first direction D1. The length of the element body 2 in the third direction D3 and the length of the element body 2 in the first direction D1 are equivalent to each other, for example. That is, in the present embodiment, the end surfaces 2a and 2b exhibit square shapes, and the main surfaces 2c and 2d and the side surfaces 2e and 2f exhibit rectangular shapes. The length of the element body 2 in the second direction D2 may be equivalent to the length of the element body 2 in the third direction D3 and the length of the element body 2 in the first direction D1 or may be shorter than the lengths thereof. The length of the element body 2 in the third direction D3 and the length of the element body 2 in the first direction D1 may differ from each other.

In the present embodiment, "being equivalent" may denote that values including a minute difference, a manufacturing error, or the like are equivalent to each other within a range set in advance, in addition to being equal to each other. For example, if a plurality of values are included within a range of ±5% of the average value of the plurality of values, it is defined that the plurality of values are equivalent to each other.

A first recessed portion 7 and a second recessed portion 8 are provided on the outer surfaces of the element body 2. Specifically, the first recessed portion 7 is provided on the end surface 2a and is recessed toward the end surface 2b. The second recessed portion 8 is provided on the end surface 2b and is recessed toward the end surface 2a.

For example, the element body 2 consists of a dielectric material (one or more kinds of alumina, magnesia, spinel, silica, forsterite, steatite, enstatite, diopside, cordierite, strontium feldspar, and zinc silicate). The element body 2 may be formed of ferrite (for example, Ni—Cu—Zn-based ferrite, Ni—Cu—Zn—Mg-based ferrite, or Cu—Zn-based ferrite).

The first terminal electrode 3 is disposed on the end surface 2a side of the element body 2. The second terminal electrode 4 is disposed on the end surface 2b side of the element body 2. The first terminal electrode 3 and the second terminal electrode 4 are separated from each other in the second direction D2. The first terminal electrode 3 is disposed inside the first recessed portion 7. The second terminal electrode 4 is disposed inside the second recessed portion 8. The first terminal electrode 3 is disposed throughout the end surface 2a and the main surface 2d. The second terminal electrode 4 is disposed throughout the end surface 2b and the main surface 2d. In the present embodiment, a surface of the first terminal electrode 3 is substantially flush with each of the end surface 2a and the main surface 2d. A surface of the second terminal electrode 4 is substantially flush with each of the end surface 2b and the main surface 2d. The first terminal electrode 3 and the second terminal electrode 4 consist of a conductive material (for example, Ag and/or Pd).

The first terminal electrode 3 exhibits an L-shape when viewed in the third direction D3. The first terminal electrode 3 has a plurality of electrode parts 3a and 3b. The electrode part 3a and the electrode part 3b are connected to each other in the ridge line portion of the element body 2 and are electrically connected to each other. In the present embodiment, the electrode part 3a and the electrode part 3b are integrally formed. The electrode part 3a extends in the first direction D1. The electrode part 3a exhibits a rectangular shape when viewed in the second direction D2. The electrode part 3b extends in the second direction D2. The electrode part 3b exhibits a rectangular shape when viewed in the first direction D1. Each of the electrode parts 3a and 3b extends in the third direction D3.

The first terminal electrode 3 is constituted of a plurality of first electrode layers 20, 21, 22, 23, 24, 25, and 26 (refer to FIG. 5D) layered in the first direction D1. Namely, a layered direction of the first electrode layers 20 to 26 is the first direction D1. In the actual first terminal electrode 3, the plurality of first electrode layers 20 to 26 are integrated to the extent that boundaries between the layers cannot be visually recognized.

The second terminal electrode 4 exhibits an L-shape when viewed in the third direction D3. The second terminal electrode 4 has a plurality of electrode parts 4a and 4b. The electrode part 4a and the electrode part 4b are connected to each other in the ridge line portion of the element body 2 and are electrically connected to each other. In the present embodiment, the electrode part 4a and the electrode part 4b are integrally formed. The electrode part 4a extends in the first direction D1. The electrode part 4a exhibits a rectangular shape when viewed in the second direction D2. The electrode part 4b extends in the second direction D2. The electrode part 4b exhibits a rectangular shape when viewed in the first direction D1. Each of the electrode parts 4a and 4b extends in the third direction D3.

The second terminal electrode 4 is constituted of a plurality of second electrode layers 30, 31, 32, 33, 34, 35, and 36 (refer to FIG. 5D) layered in the first direction D1. Namely, a layered direction of the second electrode layers 30 to 36 is the first direction D1. In the actual second terminal electrode 4, the plurality of second electrode layers 30 to 36 are integrated to the extent that boundaries between the layers cannot be visually recognized.

The first terminal electrode 3 and the second terminal electrode 4 may be provided with a plating layer (not illustrated) including Ni, Sn, or Au, for example, by performing electroplating or electroless plating. For example, the plating layer may have a Ni plated film containing Ni and covering the first terminal electrode 3 and the second terminal electrode 4, and an Au plated film containing Au and covering the Ni plated film.

The coil 5 is disposed inside the element body 2. One end of the coil 5 is connected to the first terminal electrode 3 by a connection conductor 48 (refer to FIG. 3A). The other end of the coil 5 is connected to the second terminal electrode 4 by a connection conductor 49 (refer to FIG. 5B). As illustrated in FIG. 2, the coil 5 is constituted to include a plurality of coil conductors 40, 41, 42, 43, 44, 45, and 46 and via conductors 70. The plurality of coil conductors 40 to 46 constitute the coil 5 by being connected to each other. A coil axis of the coil 5 is provided in the first direction D1. The coil conductors 40 to 46 are disposed such that at least parts thereof overlap each other when viewed in the first direction D1. The coil conductors 40 to 46 and the via conductors 70 are disposed such that they are separated from the end surfaces 2a and 2b, the main surfaces 2c and 2d, and the side surfaces 2e and 2f. The coil 5 consists of a conductive material (for example, Ag and/or Pd).

Subsequently, an example of a method for manufacturing the multilayer coil component 1 will be described with reference to FIGS. 3A to 3F, 4A to 4F, and 5A to 5D. FIGS. 3A to 3F, 4A to 4F, and 5A to 5D illustrate plan views and/or cross-sectional views of a manufacturing step. In the present embodiment, the multilayer coil component 1 is manufactured using a photolithography method. In the present embodiment, "a photolithography method" need only include processing for a desired pattern obtained by performing exposure and development of a processing target layer including a photosensitive material and is not limited by the kind or the like of a mask.

Figure 3A:
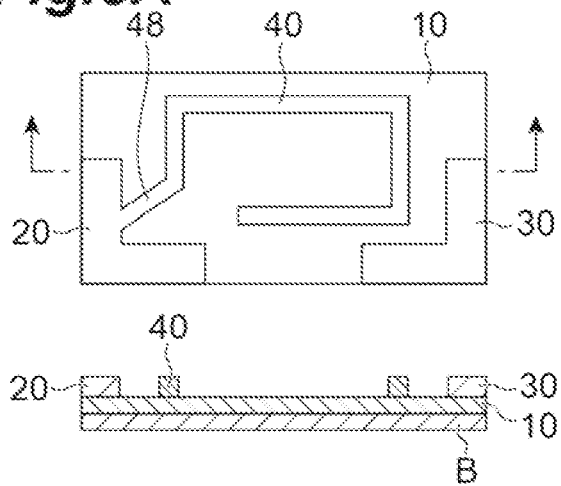
FIGS. 3A, 3B, 3C, 3D, 3E, and 3F are views illustrating a step of manufacturing a multilayer coil component.

As illustrated in FIG. 3A, first, a dielectric layer 10 is formed by coating a base material B (for example, a PET film) with a dielectric material from above. Subsequently, a first electrode layer 20, a second electrode layer 30, a coil conductor (first conductor) 40, and the connection conductor 48 are formed on the dielectric layer 10. The first electrode layer 20, the second electrode layer 30, the coil conductor 40, and the connection conductor 48 are formed using the photolithography method. Specifically, the dielectric layer 10 is coated with a photosensitive silver paste (photosensitive conductive paste) from above. Subsequently, the photosensitive silver paste is subjected to exposure by being irradiated with UV light via a mask (for example, a Cr mask) having patterns of the first electrode layer 20, the second electrode layer 30, the coil conductor 40, and the connection conductor 48 and is developed with a developing solution, thereby forming the first electrode layer 20, the second electrode layer 30, the coil conductor 40, and the connection conductor 48. The first electrode layer 20 and the coil conductor 40 are electrically connected to each other by the connection conductor 48. Hereinafter, the first electrode layers 21 to 26, the second electrode layers 31 to 36, the coil conductors 41 to 46, and the connection conductor 49 are formed by a method similar to the photolithography method described above.

Figure 3B:
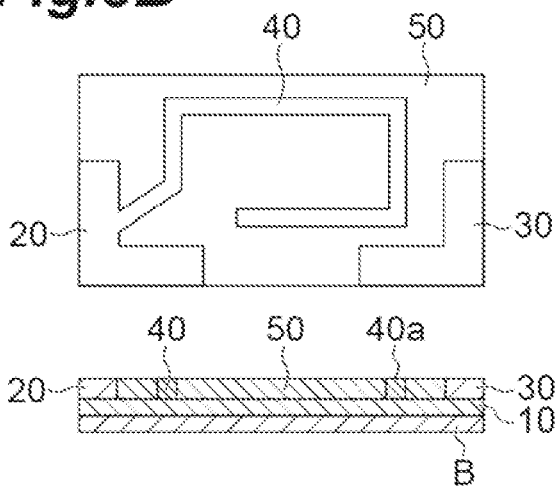

Next, as illustrated in FIG. 3B, a dielectric layer (first insulator layer) 50 is formed. The dielectric layer 50 is formed around the first electrode layer 20, the second electrode layer 30, and the coil conductor 40. The dielectric layer 50 is formed using the photolithography method. Specifically, the dielectric layer 10, the first electrode layer 20, the second electrode layer 30, the coil conductor 40, and the connection conductor 48 are coated with a photosensitive dielectric paste from above. That is, the first electrode layer 20, the second electrode layer 30, the coil conductor 40, and the connection conductor 48 are coated with a photosensitive dielectric paste such that the entire area is covered. At this time, a thickness of the photosensitive dielectric paste for coating the first electrode layer 20, the second electrode layer 30, the coil conductor 40, and the connection conductor 48 from above is smaller than a thickness of the photosensitive dielectric paste for coating other regions. Namely, a thickness of the photosensitive dielectric paste for coating regions other than the first electrode layer 20, the second electrode layer 30, the coil conductor 40, and the connection conductor 48 is larger than a thickness of the photosensitive dielectric paste on the first electrode layer 20, the second electrode layer 30, the coil conductor 40, and the connection conductor 48.

Subsequently, a resin paste is subjected to exposure by being irradiated with UV light via a mask having patterns of the first electrode layer 20, the second electrode layer 30, the coil conductor 40, and the connection conductor 48 and is developed with a developing solution, thereby forming the dielectric layer 50. The dielectric layer 50 is formed such that it becomes even with an upper surface 40A of the coil conductor 40 (the first electrode layer 20 and the second electrode layer 30). That is, the dielectric layer 50 is formed such that a thickness of the dielectric layer 50 and a thickness of the coil conductor 40 become equivalent to each other. Hereinafter, dielectric layers 51 to 56 are formed by a method similar to the photolithography method described above.

In the present embodiment, "being even" may include a minute difference, a manufacturing error, or the like within a range set in advance, in addition to that height positions of an upper surface of the coil conductor 40 and an upper surface of the dielectric layer 50 are equal to each other. For example, it may include a range of ±2 to 3 μm with respect to the average value of the heights (a distance from the dielectric layer 10 to the upper surface 40A in the first direction D1) of the coil conductor 40. When the thickness of the coil conductor 40 and the thickness of the dielectric layer 50 differ from each other, it is preferable that the thickness of the dielectric layer 50 be larger than the thickness of the coil conductor 40.

Figure 3C:
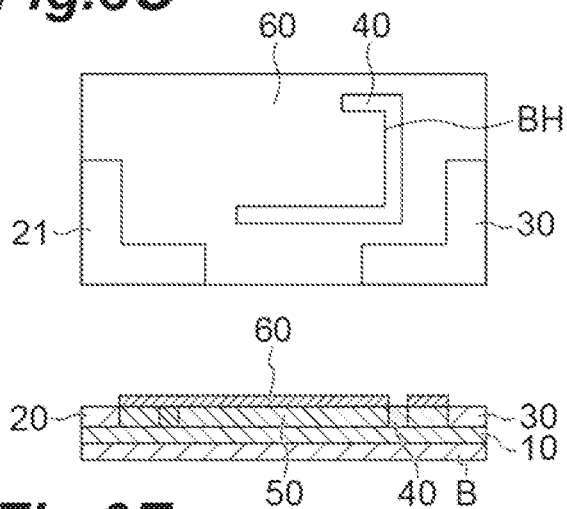

Next, as illustrated in FIG. 3C, a dielectric layer (second insulator layer) 60 is formed. A thickness of the dielectric layer 60 is smaller than the thickness of the dielectric layer 50. The dielectric layer 60 is formed using the photolithography method. Specifically, the first electrode layer 20, the second electrode layer 30, the coil conductor 40, the connection conductor 48, and the dielectric layer 50 are coated with a photosensitive dielectric paste from above. Subsequently, a photosensitive dielectric paste is subjected to exposure by being irradiated with UV light via a mask for exposing parts of the first electrode layer 20, the second electrode layer 30, and the coil conductor 40 and is developed with a developing solution, thereby forming the dielectric layer 60. The dielectric layer 60 allows parts of the first electrode layer 20, the second electrode layer 30, and the coil conductor 40 to be exposed. A via hole BH is provided in the dielectric layer 60. Hereinafter, dielectric layers 61 to 65 are formed by a method similar to the photolithography method described above.

Figure 3D:
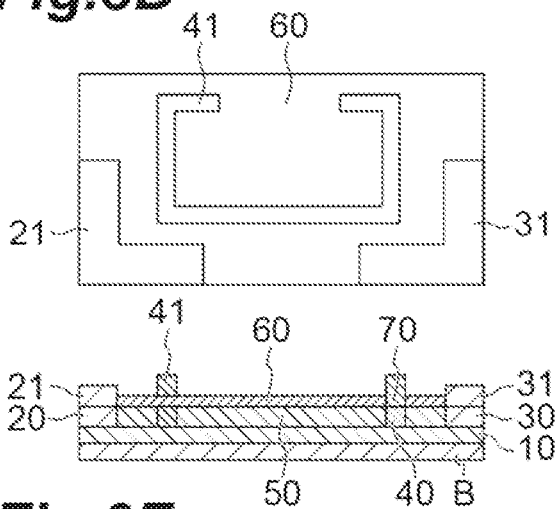
Figure 3E:
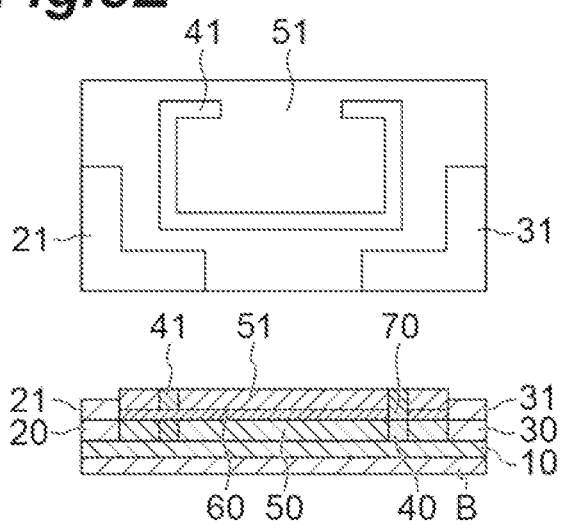
Figure 3F:
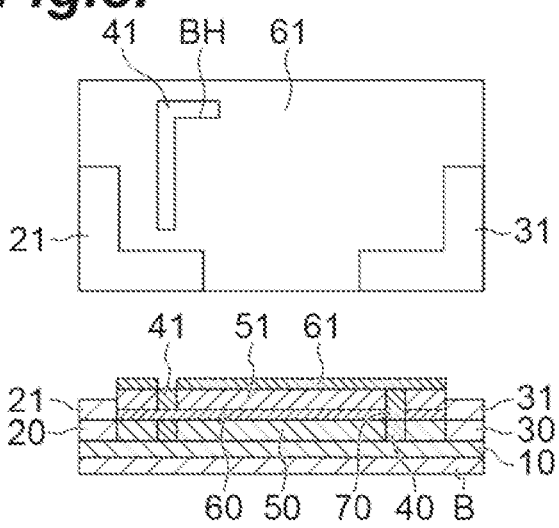

Next, as illustrated in FIG. 3D, the first electrode layer 21, the second electrode layer 31, and the coil conductor (second conductor) 41 are formed. Specifically, the first electrode layer 20, the second electrode layer 30, and the dielectric layer 50 are coated with a photosensitive silver paste from above. Accordingly, the via hole BH of the dielectric layer 60 is filled with the photosensitive silver paste. For this reason, the coil conductor 41 and the via conductors 70 are formed at the same time. The first electrode layer 21 is formed on the first electrode layer 20. The first electrode layer 21 is electrically connected to the first electrode layer 20. The second electrode layer 31 is formed on the second electrode layer 30. The second electrode layer 31 is electrically connected to the second electrode layer 32. The coil conductor 41 is electrically connected to the coil conductor 40 via the via conductors 70. Next, as illustrated in FIG. 3E, the dielectric layer 51 is formed. The dielectric layer 51 is formed on the dielectric layer 60. Next, as illustrated in FIG. 3F, the dielectric layer 61 is formed. The dielectric layer 61 allows parts of the first electrode layer 21, the second electrode layer 31, and the coil conductor 41 to be exposed. The via hole BH is provided in the dielectric layer 61.

Next, as illustrated in FIG. 4A, the first electrode layer 22, the second electrode layer 32, and the coil conductor 42 are formed. Specifically, the first electrode layer 21, the second electrode layer 31, and the dielectric layer 51 are coated with a photosensitive silver paste from above. Accordingly, the via hole BH of the dielectric layer 61 is filled with the photosensitive silver paste. The first electrode layer 22 is formed on the first electrode layer 21. The first electrode layer 22 is electrically connected to the first electrode layer 21. The second electrode layer 32 is formed on the second electrode layer 31. The second electrode layer 32 is electrically connected to the second electrode layer 31. The coil conductor 42 is electrically connected to the coil conductor 41 via the via conductors 70. Next, as illustrated in FIG. 4B, the dielectric layer 52 is formed. The dielectric layer 52 is formed on the dielectric layer 61. Next, as illustrated in FIG. 4C, the dielectric layer 62 is formed. The dielectric layer 62 allows parts of the first electrode layer 22, the second electrode layer 32, and the coil conductor 42 to be exposed. The via hole BH is provided in the dielectric layer 62.

Next, as illustrated in FIG. 4D, the first electrode layer 23, the second electrode layer 33, and the coil conductor 43 are formed. Specifically, the first electrode layer 22, the second electrode layer 32, and the dielectric layer 52 are coated with a photosensitive silver paste from above. Accordingly, the via hole BH of the dielectric layer 62 is filled with the photosensitive silver paste. The first electrode layer 23 is formed on the first electrode layer 22. The first electrode layer 23 is electrically connected to the first electrode layer 22. The second electrode layer 33 is formed on the second electrode layer 32. The second electrode layer 33 is electrically connected to the second electrode layer 32. The coil conductor 43 is electrically connected to the coil conductor 42 via the via conductors 70. Next, as illustrated in FIG. 4E, the dielectric layer 53 is formed. The dielectric layer 53 is formed on the dielectric layer 62. Next, as illustrated in FIG. 4F, the dielectric layer 63 is formed. The dielectric layer 63 allows parts of the first electrode layer 23, the second electrode layer 33, and the coil conductor 43 to be exposed. The via hole BH is provided in the dielectric layer 63.

Next, as illustrated in FIG. 5A, the first electrode layer 24 and the first electrode layer 25 are formed. The first electrode layer 24 is formed on the first electrode layer 23. The first electrode layer 25 is formed on the first electrode layer 24. In addition, the second electrode layer 34 and the second electrode layer 35 are formed. The second electrode layer 34 is formed on the second electrode layer 33. The second electrode layer 35 is formed on the second electrode layer 34.

In addition, the coil conductor 44 and the coil conductor 45 are formed. The coil conductor 44 is electrically connected to the coil conductor 43 via the via conductors 70. The coil conductor 45 is electrically connected to the coil conductor 44 via the via conductors 70.

In addition, the dielectric layer 54 and the dielectric layer 55 are formed. The dielectric layer 54 is formed on the dielectric layer 63. The dielectric layer 55 is formed on the dielectric layer 64. In addition, the dielectric layer 64 and the dielectric layer 65 are formed. The dielectric layer 64 is formed on the dielectric layer 54. The dielectric layer 65 is formed on the dielectric layer 55. The via hole BH is provided in each of the dielectric layer 64 and the dielectric layer 65.

Next, as illustrated in FIG. 5B, the first electrode layer 26, the second electrode layer 36, the coil conductor 46, and the connection conductor 49 are formed. The first electrode layer 26 is formed on the first electrode layer 25. The second electrode layer 36 is formed on the second electrode layer 35. The coil conductor 46 is electrically connected to the coil conductor 45 via the via conductors 70. The second electrode layer 36 and the coil conductor 46 are electrically connected to each other by the connection conductor 49.

Next, as illustrated in FIG. 5C, the dielectric layer 56 is formed. The dielectric layer 56 is formed on the dielectric layer 65. Next, as illustrated in FIG. 5D, a dielectric layer 11 is formed. The dielectric layer 11 is formed on the first electrode layer 26, the second electrode layer 36, and the dielectric layer 56. Last, a multilayered body is baked through heat processing. From above, the multilayer coil component 1 is obtained. As necessary, a plating layer may be provided by performing electroplating or electroless plating with respect to the first terminal electrode 3 and the second terminal electrode 4 after heat processing.

As described above, in the multilayer coil component 1 according to the present embodiment, the dielectric layers 50 to 55 are formed such that they become even with upper surfaces of the coil conductors 40 to 45, and the dielectric layers 60 to 65 provided with the via hole BH are formed on the coil conductors 40 to 45 and the dielectric layers 50 to 55. That is, the coil conductors 40 to 45 and the dielectric layers 50 to 55 are formed such that the thicknesses thereof become equivalent to each other, and the dielectric layers 60 to 65 are formed on the even upper surfaces of the coil conductors 40 to 45 and the dielectric layers 50 to 55. In this manner, in the method for manufacturing the multilayer coil component 1, since the dielectric layers 60 to 65 are formed after the heights of the coil conductors 40 to 45 and the dielectric layers 50 to 55 are aligned, the thicknesses of the dielectric layers 60 to 65 can be appropriately adjusted. For this reason, the thicknesses of the dielectric layers 60 to 65 can be reduced. Therefore, in the method for manufacturing the multilayer coil component 1, the dielectric layers 60 to 65 between the conductors can be thinned.

In the method for manufacturing the multilayer coil component 1 according to the present embodiment, in the step of forming the dielectric layers 50 to 56, after the entire area of a region including the coil conductors 40 to 46 is coated with a photosensitive dielectric paste, the photosensitive dielectric paste on the coil conductors 40 to 46 is removed. In this method, the dielectric layers 50 to 56 can be formed such that they become even with the upper surfaces of the coil conductors 40 to 46.

In the method for manufacturing the multilayer coil component 1 according to the present embodiment, in the step of forming the coil conductors 41, 43, and 45, the coil conductors 41, 43, and 45 and the via conductors 70 are formed at the same time by filling the via hole BH with a photosensitive conductive paste. In this method, since the coil conductors 41, 43, and 45 and the via conductors 70 can be formed at the same time, the manufacturing step can be made efficient.

In the method for manufacturing the multilayer coil component 1 according to the present embodiment, in the step of forming the dielectric layers 50 to 56, the thickness of the photosensitive conductive paste for coating an area around the coil conductors 40 to 46 is caused to be larger than the thickness of the photosensitive conductive paste for coating the coil conductors 40 to 46 from above. In this method, since the photosensitive conductive paste on the coil conductors 40 to 46 is easily smoothed, a magnetic path length of the coil 5 can be easily adjusted.

Hereinabove, the embodiment of the present invention has been described, but the present invention is not necessarily limited to the embodiment described above, and various changes can be made within a range not departing from the gist thereof.

In the foregoing embodiment, a form in which the coil 5 has the coil conductors 40 to 46 has been described as an example. However, the number of coil conductors is not limited to the values described above.

In the foregoing embodiment, a form in which the first terminal electrode 3 and the second terminal electrode 4 exhibit an L-shape when viewed in the third direction D3 has been described as an example. However, the shapes of the first terminal electrode 3 and the second terminal electrode 4 are not limited thereto. For example, the shapes thereof may be a rectangular parallelepiped shape (a rectangular shape when viewed in the second direction D2) or the like.

In the foregoing embodiment, a form in which in the step of forming the coil conductors 41, 43, and 45, the coil conductors 41, 43, and 45 and the via conductors 70 are formed at the same time by filling the via hole BH with a photosensitive conductive paste has been described as an example. However, a timing of forming the coil conductors 41, 43, and 45 and a timing of forming the via conductors 70 may differ from each other.

In the foregoing embodiment, a form in which in the step of forming the dielectric layers 50 to 56, the thickness of the photosensitive conductive paste for coating an area around the coil conductors 40 to 46 is caused to be larger than the thickness of the photosensitive conductive paste for coating the coil conductors 40 to 46 from above has been described as an example. However, the thickness of the photosensitive conductive paste for coating the coil conductors 40 to 46 from above and the thickness of the photosensitive conductive paste for coating an area around the coil conductors 40 to 46 may be equivalent to each other.

In the foregoing embodiment, a form in which the element body 2 is formed of a dielectric material has been described as an example. However, the element body 2 may be formed of ferrite. In this constitution, insulator layers forming the element body 2 (layers corresponding to the dielectric layers 50 to 56 and 60 to 65 of the foregoing embodiment) can be formed using a photosensitive ferrite paste (photosensitive insulator paste).

What is claimed is:

1. A method for manufacturing a multilayer coil component including
   an element body formed to have a plurality of insulator layers layered therein, and
   a coil disposed inside the element body and constituted to include a plurality of conductors and via conductors connecting the corresponding conductors to each other, the method for manufacturing a multilayer coil component comprising:
   forming the plurality of insulator layers by a photolithography method using a photosensitive insulator paste;
   forming the plurality of conductors and the via conductors by a photolithography method using a photosensitive conductive paste;
   a step of forming a first conductor;
   a step of forming a first insulator layer provided around the first conductor such that the first insulator layer becomes even with an upper surface of the first conductor;
   after the step of forming the first insulator layer, performing a step of forming a second insulator layer with a via hole exposing a part of the first conductor, the via hole extending through the second insulator layer, the second insulator layer being disposed on the first conductor and the first insulator layer; and
   a step of forming a second conductor connected to the first conductor via the via hole on the second insulator layer.

2. The method for manufacturing a multilayer coil component according to claim 1,
   wherein in the step of forming the first insulator layer, after an entire area of a region including the first conductor is coated with the photosensitive insulator paste, the photosensitive insulator paste on the first conductor is removed.

3. The method for manufacturing a multilayer coil component according to claim 1,
   wherein in the step of forming the second conductor, the second conductor and the via conductors are formed at the same time by filling the via hole with the photosensitive conductive paste.

4. The method for manufacturing a multilayer coil component according to claim 1,
   wherein in the step of forming the first insulator layer, a thickness of the photosensitive conductive paste for coating an area around the first conductor is caused to be larger than a thickness of the photosensitive conductive paste for coating the first conductor from above.

* * * * *